(12) United States Patent
Akaogi et al.

(10) Patent No.: US 6,229,735 B1
(45) Date of Patent: May 8, 2001

(54) BURST READ MODE WORD LINE BOOSTING

(75) Inventors: Takao Akaogi, Cupertino; Kendra Nguyen, San Jose; Yong Kim; Lee Cleveland, both of Santa Clara, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/638,055

(22) Filed: Aug. 11, 2000

(51) Int. Cl.⁷ .................................................. G11C 16/06
(52) U.S. Cl. ................. 365/185.23; 365/185.18; 365/185.19; 365/194
(58) Field of Search .................... 365/185.23, 185.18, 365/194, 185.19, 230.06

(56) References Cited

U.S. PATENT DOCUMENTS 5,812,457 * 9/1998 Arase ........................... 365/185.18 X
5,903,498 * 5/1999 Campardo et al. ............. 365/185.23

* cited by examiner

*Primary Examiner*—Huan Hoang
(74) *Attorney, Agent, or Firm*—Brinks, Hofer, Gilson & Lione

(57) ABSTRACT

A burst read mode operation is provided that boosts the voltage of a word line while the bit lines of the row are selected for reading. When the column group address bits read the last column group of cells in the row, a pulse signal is generated which temporarily reduces the boosted voltage to allow the X-decoder to select the next word line. An alternative delay element is also provided which generates an ATD pulse with a longer duration when the column group address bits are at the end of a row and a shorter duration pulse at other times.

8 Claims, 3 Drawing Sheets

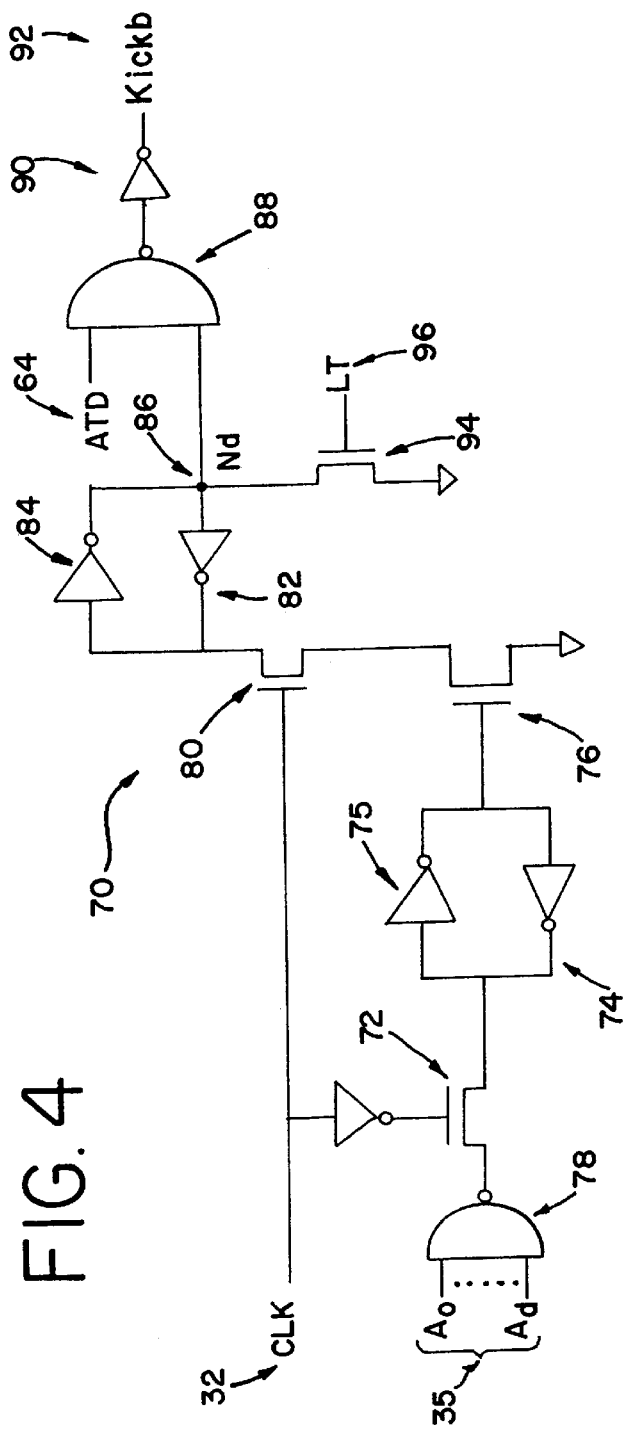
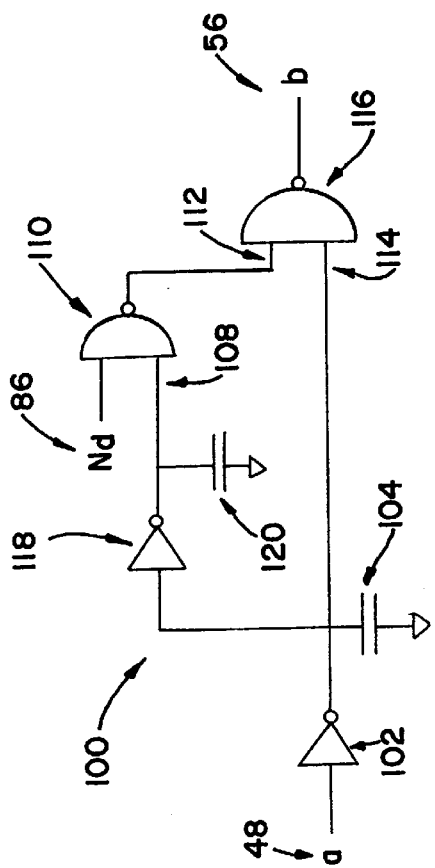
FIG. 4
FIG. 5

BURST READ MODE WORD LINE BOOSTING

FIELD OF THE INVENTION

The present invention relates generally to memory devices and, more particularly, to selecting word lines during a burst mode reading operation.

BACKGROUND OF THE INVENTION

One type of memory device which has found wide commercial success in the electronics industry is commonly referred to as flash memory. This commercial success is due in part to the ability of flash memory devices to store electronic data over long periods of time without an electric power supply. In addition, flash memory devices can be erased and programmed by the end user after they are installed in an electronic device. This combined functionality is especially useful in electronic device applications, such as cellular telephones, personal digital assistants, and computer BIOS storage, and other applications where power supply is intermittent and programmability is desired.

Flash memory devices are made up of an array of individual memory transistors, or cells, which are similar to those used in other types of memory devices. Flash memory devices, however, typically achieve non-volatility of the memory cells by the addition of a floating gate between the control gate and the substrate region of the transistors. Like other memory devices, the transistors are oriented in rows and columns to form an array of transistors. As is common in the memory device art, the control gates of the memory cells in each row of the array are connected to a series of word lines, thus forming individual rows of cells that can be accessed by selecting the corresponding word line. Similarly, the drain regions of the cells in each column of the array are connected to a series of bit lines, thus forming individual columns of cells that can be accessed by selecting the corresponding bit lines. Finally, the source regions of each of the cells in the array are connected to a common source line. In some flash memory devices the array of transistors is subdivided into sectors of separate transistor arrays to provide added flexibility to the programming and erasing operations.

The data stored in each memory cell represents a binary 1 or 0, as is well-known in the art. To perform a program, read, or erase operation on a particular cell in the array, various predetermined voltages are applied to the control gate, drain region, and source region of the memory cell. By applying these predetermined voltages to a particular bit line column, a particular word line row, and the common source line, an individual cell at the intersection of the bit line and word line can be selected for reading or programming.

To program a cell, the control gate and the drain region of the cell are raised to predetermined programming voltages and the source is grounded. The voltages on the control gate and the drain region cause the generation of hot electrons which are injected onto the floating gate where they become trapped, forming a negative charge on the floating gate. This electron transfer mechanism is often referred to as Channel Hot Electron (CHE) injection. When the programming voltages are removed, the negative charge on the floating gate is maintained, thereby raising the threshold voltage. The threshold voltage is used during reading operations to determine if the cell is in a charged state, that is programmed, or whether the cell is in an uncharged state, that is un-programmed.

Cells are read by applying a predetermined voltage to the control gate and the drain region and grounding the source of the cell. The current in the bit line is then sensed with a sense amplifier. If the cell is programmed, the threshold voltage will be relatively high and the bit line current will be zero or at least relatively low, thus registering a binary 0. On the other hand if the cell is erased, the threshold voltage will be relatively low and the bit line current will be relatively high, thus registering a binary 1.

In contrast to the programming procedure, flash memory devices are typically bulk-erased by simultaneously erasing all the cells in a memory sector. One procedure for erasing an entire memory sector involves applying predetermined voltages to the common source line and all the word lines of the sector while the drain regions of the cells are left to float. This causes electron tunneling from the floating gate to the source region through Fowler-Nordheim (F-N) tunneling, which removes the negative charge from the floating gate of each of the cells in the memory sector.

Typically, the memory device is provided with a number of address pins that allow the user to specify individual groups of memory cells for various operations. As is well-known in the art, the number of address pins usually provided for selecting the rows of cells is equal to $2^x$, where x is the number of word lines in the memory device. Similarly, the number of address pins usually provided for selecting column groups of cells is equal to $2^y$, where y is the number of bytes or words in each row of cells (a byte being eight cells and a word being sixteen cells). When the memory device is performing internal embedded functions, the address bits for the row and column bits will sometimes be generated by a state machine within the memory device instead of being provided by the user through the address pins. The memory device also provides a number of data pins for input and output of the memory cell data. In a simple memory device, the number of data pins is equal to the number of column groups of cells that are selected by the column address bits.

In order to translate the row and column address bits into the specific word lines and bit lines that must be selected for an operation, a X-decoder and an Y-decoder are usually provided in the memory device. As is well-known in the art, the X-decoder receives the row address bits and connects the particular word line that corresponds to the address signal to the appropriate circuits. For example, in the case of a reading operation, the X-decoder will connect the selected word line to a voltage boosting circuit. Likewise, the Y-decoder receives the column address bits and connects the particular bit lines that correspond the address signal to the appropriate circuits. In reading operations, the Y-decoder will connect each of the selected bit lines to a sense amplifier.

Typically, the read operations are performed as a random access function, in which the user specifies a particular address in the memory array for the memory device to read. However, one function that can be provided in the memory device is a burst read mode. A burst read mode is an embedded function that sequentially reads the data in the entire memory array and outputs the data to the user during succeeding clock cycles. In this mode, the user does not need to provide the cell addresses because the state machine in the memory device sequentially generates each cell address in the memory array. Generally, this function is useful when the user desires an output of the entire data in the memory device.

A number of important performance factors must be considered when designing a burst read mode, however. For example, flash memory devices are often used in hand held devices that provide a limited capacity power supply. Thus, the power consumption during the read function should be minimized. In addition, the speed of the burst read mode should be quick so that the user can receive the entire output of the memory device without having to wait for the device. Another problem is that some circuits in the memory device can only operate correctly when the applied voltages are within a restricted range. Thus, the voltage must be regulated to ensure proper functioning of the device.

BRIEF DESCRIPTION OF SEVERAL VIEWS OF THE DRAWINGS

The invention, including its construction and method of operation, is illustrated more or less diagrammatically in the drawings, in which:

FIG. 4 is a circuit diagram of a circuit that generates a kickb signal; and

FIG. 5 is a circuit diagram of an alternative delay element that can be substituted into the ATD circuit.

DETAILED DESCRIPTION OF THE INVENTION

Figure 1:
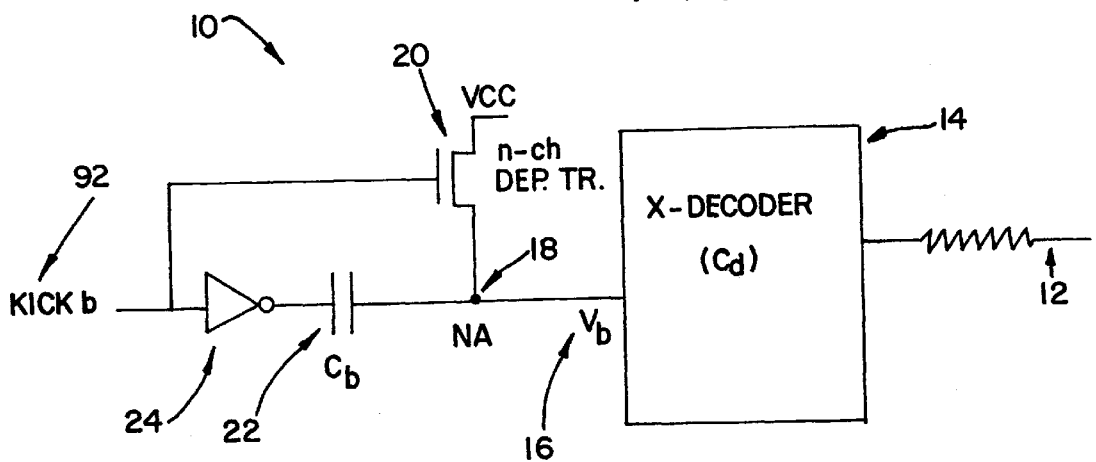
FIG. 1 is a circuit diagram of a circuit that boosts the voltage of word lines.

Referring now to the drawings, and particularly to FIG. 1, a boosting circuit 10 is shown for boosting the voltage in the word lines 12 during read operations. In order to read the binary state of a memory cell in the memory array, the word line 12 for the particular cell must be boosted to a voltage above the threshold voltage. In one example, the threshold voltage of the memory cells is about 2.5 V, and $V_{cc}$ of the memory device is about 1.8 V. Thus, in order to read the memory cells, $V_{cc}$ must be boosted from 1.8 V to a voltage greater than 2.5 V. In a preferred embodiment, this boosted voltage, or $V_b$ 16, is about 4 V.

In the burst read mode, the address bits for the memory cells are generated by the state machine in sequential order, starting with the first cell in the array and proceeding until the last cell in the array is read. The state machine begins the address sequencing by selecting the first word line 12 in the memory array.

Each of the column groups of cells are then sequentially read by connecting each group of bit lines to the sense amplifiers one after each other until all the cells in the first row of the array have been read. The state machine then sequences the address bits to select the next word line 12 for the next row. The first column group of cells is then reselected and the reading sequence begins again until the second row is complete. This process continues until the memory device completes reading of the last word line 12 in the array.

Accordingly, the X-decoder 14 connects the boosting circuit 10 to each of the word lines 12 as they are individually selected by the state machine. When the boosting circuit 10 is connected to a word line 12, the voltage in the word line 12 is boosted above the threshold voltage of the memory cells to a boosted voltage of $V_b$ 16. As is well understood by those skilled in the art, the boosting circuit 10 will follow the engineering formula of $V_b = V_{cc} \cdot (C_b/(C_b+C_d)+1)$, where $C_b$ is the capacitance of the first capacitor 22 and $C_d$ is the parasitic capacitance of the X-decoder 14. In the boosting circuit 10 the kickb signal 92 provides $V_{cc}$ to the circuit 10 in the form of a pulse to $V_{cc}$. The circuit 70 for producing the kickb signal 92 is shown in FIG. 4 and will be described in more detail below. In the boosting circuit 10, the kickb signal 92 is connected to an inverter 24 which is connected to one side of the first capacitor 22. The kickb signal 92 is also connected to an n-channel depletion transistor 20, which has a negative threshold voltage. When the transistor 20 is switched on, the node NA 18 is connected to $V_{cc}$.

Accordingly, the word line 12 is boosted to $V_b$ 16, which is about 4 V, during the entire time that the state machine sequences the column address bits 35 through each of the column groups of cells in the row. Thus, it is unnecessary to provide separate boosting of the word line 12 when each of the groups of bit lines is connected to the sense amplifiers. However, one problem that is encountered is that the X-decoder 14 is not able to switch the connection of the booster circuit 10 to the next word line 12 when the word line 12 is boosted above $V_{cc}$. Thus, in order for the X-decoder 14 to properly function when the state machine generates the next row address bits, the voltage of the word line 12 must be dropped back to $V_{cc}$ temporarily when the address sequence of the column group address bits 35 reach the end of each row.

Figure 2:
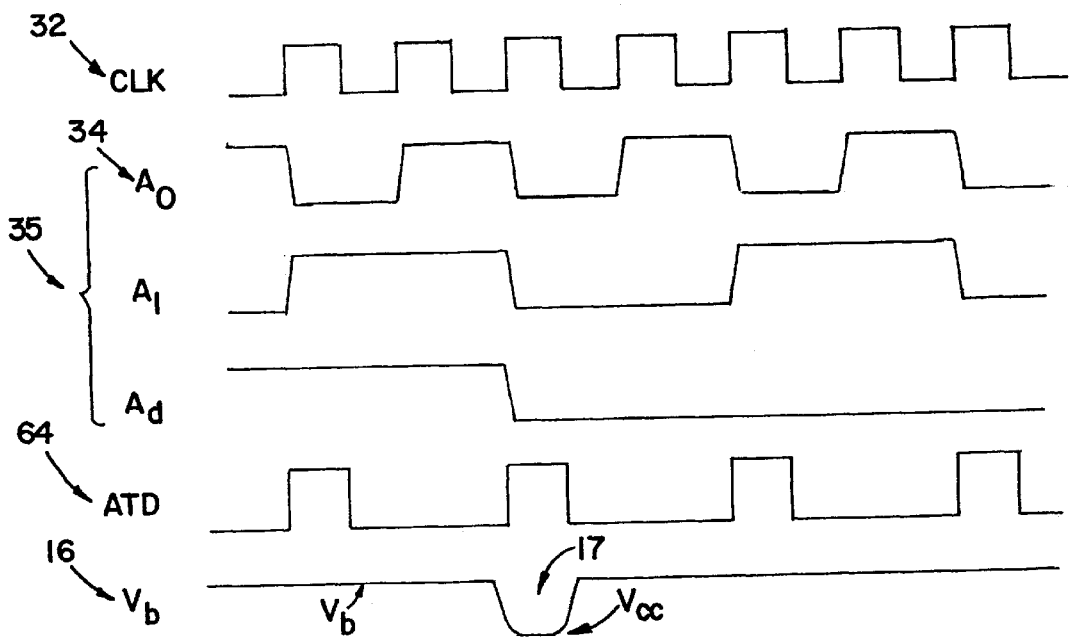
FIG. 2 is a series of signal charts, showing a clock signal, column group address bits, an ATD signal, and an inverted pulse in $V_b$.

Turning to FIG. 2, several signal charts are shown. The clock signal 32 is an external clock cycle that is provided by the electronic device that the memory device is installed in. The clock signal 32 is provided to the memory device through a pin. The signals for the column group address bits 35 are also shown, with $A_o$ 34 being the least significant bit and $A_d$ being the most significant bit. Accordingly, the state machine generates a new address signal 35 at each rising edge of the clock signal 32. Therefore, $A_o$ 34 changes between binary states 0 and 1 with each new address 35. As shown in the chart, when the address sequence 35 reaches the end of a word line 12, the status of all the column group address bits 35 is a binary 1.

Figure 3:
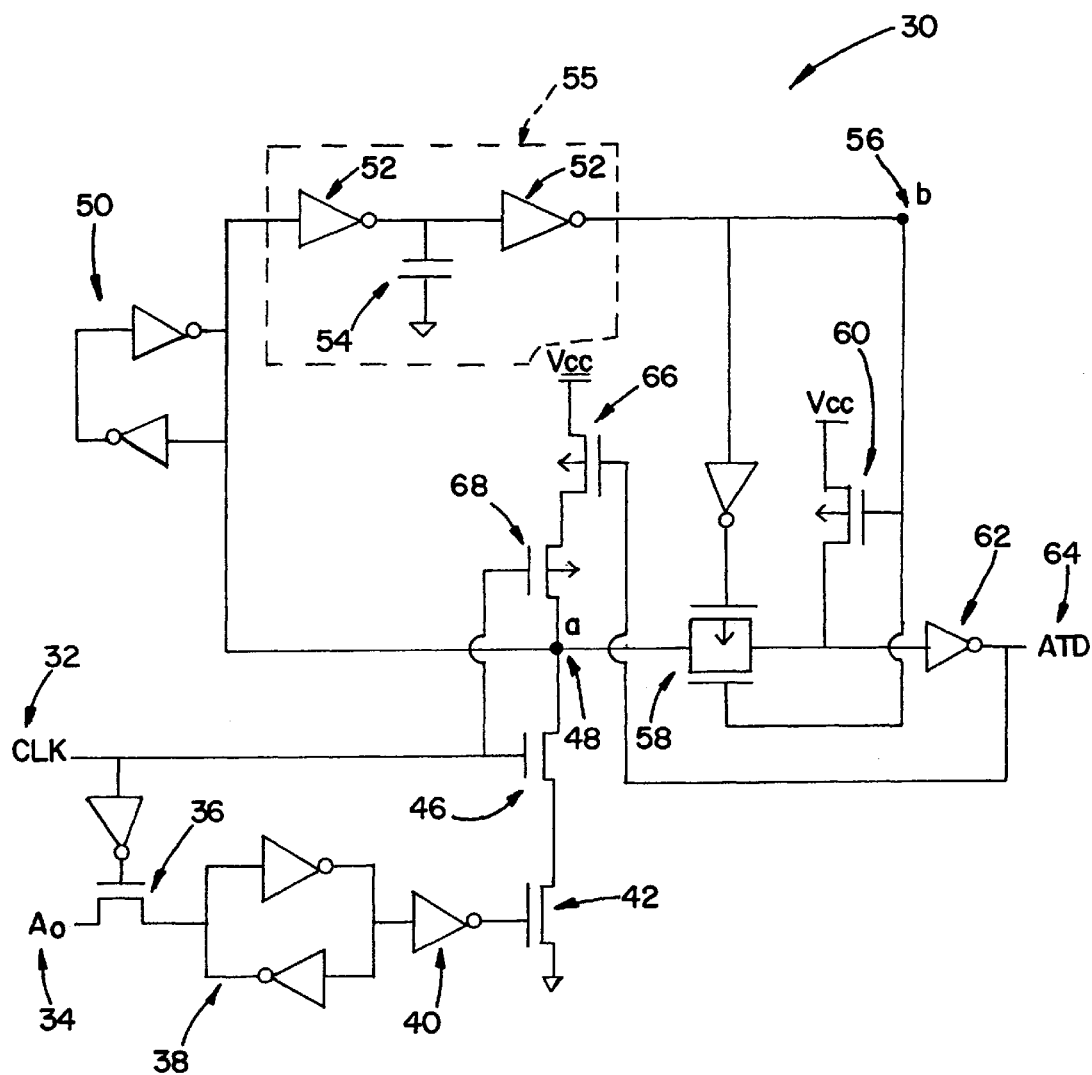
FIG. 3 is a circuit diagram of a circuit that generates the ATD signal.

Turning to FIG. 3, a circuit 30 is shown for generating the ATD ("Address Transition Detection") signal 64. As shown in FIG. 2, the ATD signal 64 is a pulse signal that pulses to a binary state of 1 at the falling edge of $A_o$ 34. The ATD circuit 30 uses the clock signal 32 and $A_o$ 34 as inputs to the circuit 30. In the initial state of the circuit 30, node a 48 and node b 56 are at binary states 1. The clock 32 allows $A_o$ 34 to pass through the first n-channel transistor 36 when the clock 32 is binary state 0. Thus, when the clock 32 is 0 and $A_o$ 34 is 1, a binary state 1 will be passed to the first latch 38, which retains the binary state 1 after the clock 32 switches to 1 and turns off the first n-channel transistor 36. An inverter 40 then turns on the second n-channel transistor 42 which connects the third n-channel transistor 46 to ground. Accordingly, when the clock 32 changes to 1, the third n-channel transistor 46 will turn on and connect node a 48 to ground, thus forcing node a 48 to binary state 0.

Node b 56, however, does not immediately change to 0 to match node a 48. The signal from node a 48 first travels through the second latch 50 and then through a delay element 55. The delay element 55 includes two inverters 52 and a capacitor 54 which serves to slow the signal from reaching node b 56. While node b 56 remains at binary state 1, the pass gate 58 remains turned on and allows the signal from node a 48 to pass through to the output 64, where an inverter 62 converts the signal to a binary state 1. However, when the binary state 1 signal passes through the delay element 55 and reaches node b 56, the pass gate 58 is turned off to block node a 48 from the output 64. At the same time, node b 56 turns on a p-channel transistor 60 to connect the output 64 to $V_{cc}$. The inverter 62 then converts $V_{cc}$ to a binary state 0, thus changing the output 64 from 1 back to 0.

The circuit 30 is reset to the initial state by the binary state 0 of the ATD signal 64 which turns on the second p-channel transistor 66. When the clock signal 32 returns to 0, the third p-channel transistor 68 also turns on, thus passing $V_{cc}$ to node a 48 and driving node a 48 to 1. Node b 56 is then also forced to 1 which turns off the first p-channel transistor 60 and turns on the pass gate 58. $V_{cc}$ is then supplied fromrn node a 48 to the inverter 62 and the output 64. From this description it is now apparent that the resulting ATD signal 64 forms a pulse that is produced at the rising edge of every other clock cycle 32 when $A_o$ 34 falls from binary 1 to 0. The duration of the pulse can be lengthened or shortened by modifying the delay element 55 with more or less capacitance.

Turning now to FIG. 4, a circuit 70 is shown for generating the kickb signal 92. The kickb signal 92 is a pulse signal that pulses to binary state 1 and provides the input to the booster circuit 10. The kickb circuit 70 uses the clock signal 32 and each of the column group address bits 35 as the inputs to the circuit 70. The column group address bits 35 are connected to a first nand gate 78. The output of the nand gate 78, thus, will be a binary state 1 when any one of the address bits 35 is 0 and will be a binary state 0 only when all of the address bits 35 are 1. Therefore, when all the address bits 35 are 1 (indicating the last column group in a row of cells), a binary state 0 passes through the first n-channel transistor 72 while the clock signal 32 is 0. The binary state 0 is then retained by the first latch 74 after the clock signal 32 changes to 1 and turns off the first n-channel transistor 72. The first inverter 75 of the first latch 74 converts the retained signal from 0 to 1, thus turning on the second n-channel transistor 76. Therefore, when the clock signal 32 changes to 1 and turns on the third n-channel transistor 80, the second latch 82 will be connected to ground.

The first inverter 84 of the second latch 82 then converts the binary state 0 of the ground to 1 at node $N_d$ 86. Like the first nand gate 78, the second nand gate 88 only passes a binary state 0 to the output when all of the inputs 64, 86 are 1. Therefore, when the ATD signal 64 pulses to 1, the inverter 90 converts the second nand gate 88 output of 0 to the kickb signal 92 with a binary state 1. However, when the ATD signal 64 returns to 0, the kickb signal 92 returns to binary state 0. Node $N_d$ 86 is also connected to the fourth n-channel transistor 94, which is turned on by the LT signal 96. The LT signal 96 is a pulse signal that pulses after the ATD signal 64 returns to 0. Thus, the LT signal 96 resets node $N_d$ 86 to 0 by connecting node Nd 86 to ground. This prevents the retained binary state 1 of node $N_d$ 86 from generating additional kickb pulses 92 when the ATD signal 64 pulses at subsequent clock cycles 32. Other signals besides the LT signal 96 which pulse after the falling edge of the ATD signal 64 could also be used in place of the LT signal 96. From this description it is now apparent that the kickb signal 92 forms a pulse that is generated at the rising edge of the ATD pulse 64 when all of the column group address bits 35 are at binary state 1. In addition the duration of the kickb pulse 92 is controlled by the length of the ATD pulse 64.

Returning now to FIG. 1 and the signal chart of $V_b$ 16 in FIG. 2, it is now apparent that the pulse of the kickb signal 92 to binary state 1 resets the boosting circuit 10 by forcing $V_b$ 16 down to $V_{cc}$ 17. As explained above, the X-decoder 14 can now function properly when switching the word line 12 connection to the next word line 12 for additional read operations. Accordingly, the state machine generates the next row address bits during the inverted pulse 17 in $V_b$ 16, thereby initiating the X-decoder 14 to switch word lines 12.

Various durations in the inverted $V_b$ pulse 17 are possible, but preferably a duration of about 15 ns is provided.

Turning now to FIG. 5, an alternative delay element 100 is shown for producing the ATD signal 64. In addition to the circuits described above the ATD pulse 64 is also used by other circuits in the memory device. Thus, the duration of the ATD pulse 64 not only controls the inverted $V_b$ pulse 17, but also affects other functions in the memory device also. However, the other circuits that use the ATD signal 64 typically do not require an ATD pulse 64 with a duration as long as that required by the boosting circuit 10 and boosting trigger circuit 70 described above. One result of an unnecessarily long ATD pulse 64 is that many of the other memory device functions will operate slower than would be possible with a shorter ATD pulse 64.

Therefore, the alternative delay element 100 provides a duration of the ATD pulse 64 that is longer when the inverted $V_b$ pulse 17 is required and is shorter at all other times. Accordingly, the alternative delay element 100 can be substituted into the ATD circuit 30 shown in FIG. 2 in the place of the delay element 55, which includes the capacitor 54 and the two inverters 52. Therefore, node a 48 provides the input 48 for the alternative delay element 100, and the output 56 is provided to node b 56. During normal cycles of the ATD signal 64 when the column group address bits 35 are not at the end of a row of cells, Nd 86 will be at a binary state 0 as previously described. The output 112 of the first nand gate 110 will then be binary state 1, regardless of the state of the second input 108 of the first nand gate 110. Therefore, the state of node a 48 will control the output 56 of the second nand gate 116 without any influence from $N_d$ 86. Accordingly, when node a 48 is 1, the first input 112 to the second nand gate 116 will be 1 and the second input 114 will be 0, thus producing an output 56 of binary state 1. On the other hand, when node a 48 is 0, the first input 112 will still be 1 and the second input 114 will now be 1, thus producing an output 56 of binary state 1. Thus, when Nd 86 is 1, the first capacitor 104 will delay the output 56 of the circuit 100, but the second capacitor 120 will have no effect on the circuit 100.

However, when the column group address bits 35 reach the end of a row of cells, $N_d$ 86 rises to binary state 1 as described previously. At the same time that $N_d$ 86 rises to 1, node a 48 falls to binary state 0. Node a 48 is then converted by the first inverter 102 to binary state 1. This state, however, does not reach the second input 114 of the second nand gate 116 immediately because of the delay caused by the first capacitor 104. Thus, the second input 114 temporarily remains at binary state 0. The second input 108 of the first nand gate 110 also temporarily remains at its previous binary state 1. Since $N_d$ 86 has now changed to binary state 1, the output 112 of the first nand gate 110 changes to binary state 0. This does not change the output 56 of the second nand gate 116, however, which remains at binary state 1. After being delayed by the first capacitor 104, the binary state 1 from the first inverter 102 then passes to the second input 114 of the second nand gate 116. However, this also does not change the output 56 of the second nand gate 116 because of the binary state 0 of the first input 112. The signal from the first inverter 102 also passes through the second inverter 118 to the second capacitor 120. The second capacitor 120 then delays the signal further. Once the signal passes to the second input 108 of the first nand gate 110 after being delayed, $N_d$ 86 is at a binary state 1 and the second input 108 is now 0, thus changing the output 112 of the first nand gate 110 from 0 to 1. Now that the first input 112 of the second nand gate 116 is 1 and the second input 114 is also 1, the output 56 of the second nand gate 116 finally changes from binary state 1 to 0.

As is now apparent, the alternative delay element 100 does not change the logical functioning of the original delay element 55. That is, when node a 48 changes from 1 to 0, node b 56 follows this change by also changing from 1 to 0. The converse is also true. The alternative delay element 100, however, modulates the ATD pulse 64 duration by providing a shorter duration, defined by the first capacitor 104 during normal cycles of the ATD signal 64. The ATD pulse 64 duration can then be optimized for the other circuits that also use the ATD signal 64. Preferably, the ATD pulse 64 duration during these normal cycles will be about 10 ns. On the other hand, the circuit provides a longer pulse duration, defined by the first capacitor 104 and the second capacitor 120, when the column group address bits 35 reach the end of a row of cells. This provides a longer inverted pulse 17 in $V_b$ 16 to allow the X-decoder 14 to switch word lines 12. Preferably, the longer ATD pulse 64 duration is about 20 ns.

While a preferred embodiment of the invention has been described, it should be understood that the invention is not so limited, and modifications may be made without departing from the invention. The scope of the invention is defined by the appended claims, and all devices that come within the meaning of the claims, either literally or by equivalence, are intended to be embraced therein.

We claim:

1. A method of generating an output pulse signal, comprising:
    a) oscillating a clock signal between first and second binary states;
    b) oscillating an address bit between first and second binary states;
    c) connecting a first node to a first voltage when said clock oscillates between either of said binary states and when said address bit oscillates from said first binary state to said second binary state;
    d) connecting said first node to an output, thereby producing a leading edge of said output pulse signal;
    e) delaying said first voltage from reaching a second node; and
    f) disconnecting said first node from said output when said first voltage reaches said second node, thereby producing a trailing edge of said output pulse signal.

2. The method according to claim 1, wherein said delaying comprises:
    a) generating an input pulse signal when a number of address bits oscillate together from one of a first and second binary states to the other binary state;
    b) delaying said first voltage with a first capacitor when said input pulse signal is not asserted; and
    c) delaying said first voltage with said first capacitor and a second capacitor when said input signal is asserted.

3. The method according to claim 1, further comprising connecting a second voltage to said output when said first voltage reaches said second node.

4. The method according to claim 3, further comprising connecting said first node to said second voltage after said trailing edge of said pulse signal, wherein said first node is connected to said output when said second voltage reaches said second node.

5. A method of generating an output pulse signal, comprising:
    a) oscillating a clock signal between first and second binary states;
    b) oscillating a number of address bits between first and second binary states;
    c) connecting a node to a first voltage when said clock oscillates between either of said binary states and when all of said address bits oscillate together from one of said binary states to the other binary state;
    d) generating an input pulse signal with a predetermined duration; and
    e) oscillating an output signal between a first and second binary state, wherein said second binary state is generated only after said node is connected to said first voltage and for the time period of said duration of said input pulse signal, thereby producing said output pulse signal.

6. The method according to claim 5, further comprising connecting said node to a second voltage when a reset signal changes binary states, thereby preventing said output pulse signal from returning to said second binary state when said input pulse signal is asserted.

7. A circuit for delaying a signal, comprising:
    a) a first input connected to a first inverter;
    b) a first capacitor connected to said first inverter;
    c) a second inverter connected to said first inverter;
    d) a second capacitor connected to said second inverter;
    e) a first nand gate, said second capacitor being connected to one input of the first nand gate and a second input being connected to another input of the first nand gate; and
    f) a second nand gate, said first capacitor being connected to one input of the second nand gate and said first nand gate being connected to another input of the first nand gate.

8. A method of boosting word lines in a memory device, comprising:
    a) oscillating a clock signal between first and second binary states;
    b) oscillating a number of address bits between first and second binary states;
    c) connecting a first node to a first voltage when said clock oscillates between either of said binary states and when all of said address bits oscillate together from one of said binary states to the other binary state;
    d) connecting a second node to a third voltage when said clock oscillates between either of said binary states and when one of said address bits oscillates from said first binary state to said second binary state;
    e) connecting said second node to a first output, thereby producing a leading edge of a first pulse signal;
    f) delaying said third voltage from reaching a third node;
    g) disconnecting said second node from said first output when said third voltage reaches said third node, thereby producing a trailing edge of said first pulse signal;
    h) oscillating a second output signal between a first and second binary state, wherein said second binary state is generated only after said first node is connected to said first voltage and for the time period between said leading edge and trailing edge of said first pulse signal, thereby producing a second output pulse signal;
    i) boosting the voltage of a first word line with a boosting circuit during said second binary state of said second output pulse signal; and
    j) relieving said boosted voltage of said first word line during said first binary state of said second output pulse signal, said first word line being disconnected from said boosting circuit and a second word line being connected to the boosting circuit during said relieving.

* * * * *

UNITED STATES PATENT AND TRADEMARK OFFICE
CERTIFICATE OF CORRECTION

PATENT NO. : 6,229,735 B1 Page 1 of 1
DATED : May 8, 2001
INVENTOR(S) : Takao Akaogi et al.

It is certified that error appears in the above-identified patent and that said Letters Patent is hereby corrected as shown below:

<u>Title page,</u>
Item [73], should read

-- [73] Assignee: Advanced Micro Devices, Inc.
Sunnyvale, CA and

Fujitsu Limited
Kanagawa, (JP) --

Signed and Sealed this

Tenth Day of June, 2003

JAMES E. ROGAN
*Director of the United States Patent and Trademark Office*